United States Patent [19]

Nakao et al.

[11] Patent Number: 5,303,182

[45] Date of Patent: Apr. 12, 1994

[54] NONVOLATILE SEMICONDUCTOR MEMORY UTILIZING A FERROELECTRIC FILM

[75] Inventors: Hironobu Nakao; Takashi Nakamura, both of Kyoto, Japan

[73] Assignee: Rohm Co., Ltd., Kyoto, Japan

[21] Appl. No.: 973,074

[22] Filed: Nov. 6, 1992

[30] Foreign Application Priority Data

Nov. 8, 1991 [JP] Japan ................. 3-321045
Nov. 11, 1991 [JP] Japan ................. 3-323930

[51] Int. Cl.$^5$ ............................... G11C 11/22
[52] U.S. Cl. ........................ 365/145; 365/149; 257/295
[58] Field of Search ............ 365/145, 149; 257/295

[56] References Cited

U.S. PATENT DOCUMENTS

| | | | |
|---|---|---|---|
| 4,893,272 | 1/1990 | Eaton, Jr. et al. | 365/145 |
| 5,046,043 | 9/1991 | Miller et al. | 365/145 |
| 5,146,299 | 9/1992 | Lampe et al. | 365/145 X |
| 5,189,594 | 2/1993 | Hoshiba | 365/145 X |
| 5,216,572 | 6/1993 | Larson et al. | 365/145 X |
| 5,227,855 | 7/1993 | Momose | 365/145 |

OTHER PUBLICATIONS

"A Nonvolatile Memory FET Using Ferroelectric Thin Film PbtIO$_3$", Yasushi Matsui et al., *Technical Study Reports of the Institute of Electronics and Communication Engineers*, vol. 78, No. 179, pp. 1-8, 1978.

*Primary Examiner*—Eugene R. LaRoche
*Assistant Examiner*—Do Hyun Yoo
*Attorney, Agent, or Firm*—Brumbaugh, Graves, Donohue & Raymond

[57] ABSTRACT

Two memory cells are formed adjacent each other on a semiconductor substrate. In each memory cell, eight MOS transistors are formed between two selection transistors such that the MOS transistors and the selection transistors are connected in series, and that a source/drain diffusion layer is shared by adjacent ones of the selection transistors and the MOS transistors. A drain layer is shared by two adjacent selection transistors of the two memory cells. Ferroelectric capacitors are formed on the respective MOS transistors. A common electrode serves both as a gate electrode of the MOS transistor and a bottom electrode of the ferroelectric capacitor. Gate electrodes of the selection transistors, the common electrodes, and top electrodes of the ferroelectric capacitors are connected to word lines, and the above drain diffusion layer is connected to a bit line.

3 Claims, 5 Drawing Sheets

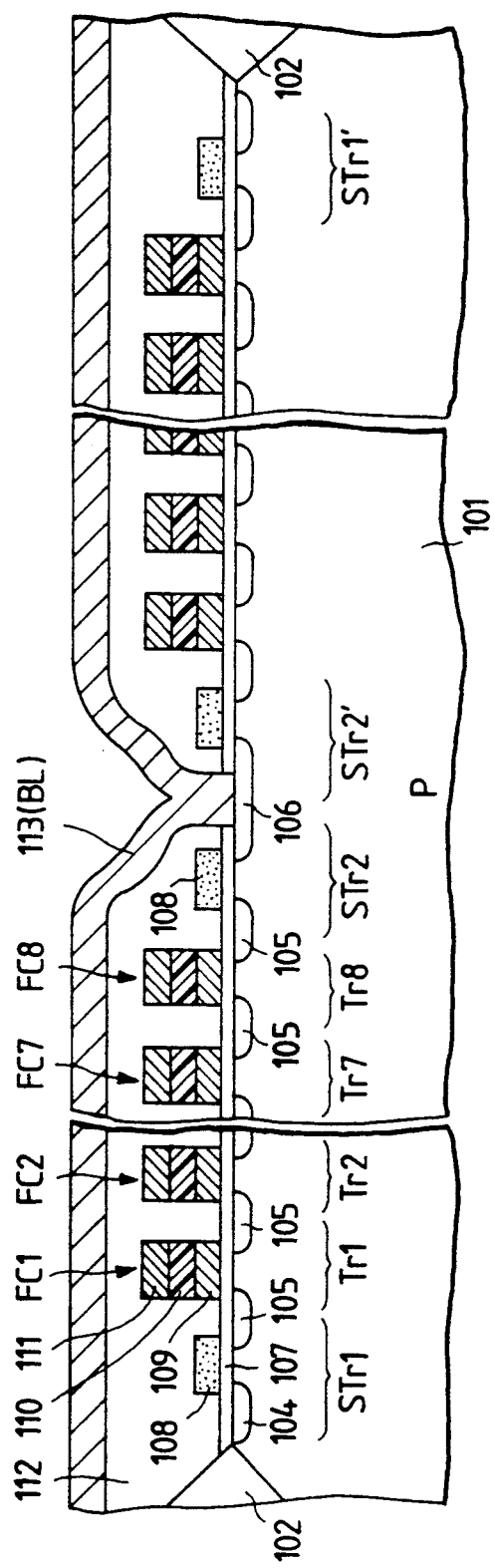
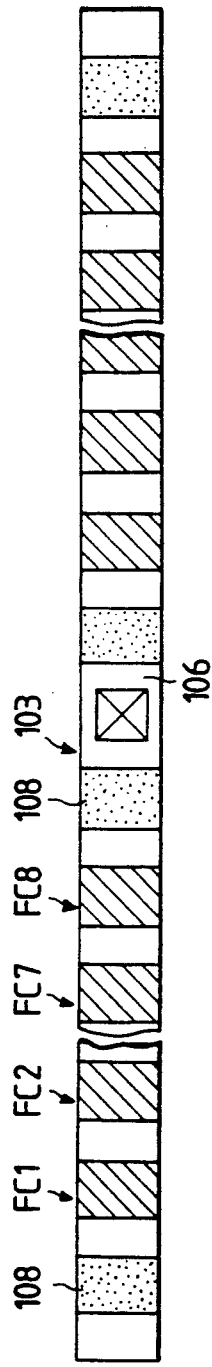
FIG. 7(a)
FIG. 7(b)

NONVOLATILE SEMICONDUCTOR MEMORY UTILIZING A FERROELECTRIC FILM

BACKGROUND OF THE INVENTION

The present invention relates to nonvolatile semiconductor memories such as an EEPROM (electrically erasable and programmable ROM) that stores information utilizing residual polarization in a ferroelectric material. Further, the invention relates to a device having the MFSFET (metal ferroelectric semiconductor FET) structure that employs a ferroelectric film as a gate insulating film.

Referring to FIG. 1, a structure of a conventional MFSFET device is described.

In FIG. 1, reference numeral 1 represents, for instance, a p-type silicon substrate, in which an n+-type drain diffusion layer 2 and an n+-type source diffusion layer 3 are formed. A ferroelectric film 4 made of, for instance, lead zirconate titanate (PZT) and a gate electrode 5 are formed on the substrate 1 between the drain and source diffusion layers 2 and 3. Reference numeral 6 represents an interlayer insulating film 6, and numeral 7 represents metal leads connected to the drain and source diffusion layers 2 and 3, respectively.

The ferroelectric film 4 of the above MFSFET device exhibits a hysteresis characteristic as shown in FIG. 2. In FIG. 2, the abscissa represents an electric field E acting on the ferroelectric film 4 and the ordinate represents polarization charge P of the ferroelectric film 4. Assume here a positive voltage $V_{MAX}$ which will cause an electric field acting on the ferroelectric film 4 that is equal to or stronger than $E_{sat}$. If the voltage $V_{MAX}$ is applied to the gate electrode 5, the ferroelectric film 4 is polarized to a state indicated by symbol A in FIG. 2, and a channel is formed between the source diffusion layer 3 and the drain diffusion layer 2 of the device of FIG. 1. Even if the gate voltage is thereafter reduced to 0V, the polarization charge P is only slightly reduced to a state B, i.e., a polarization (spontaneous polarization) of a considerable amount remains, so that the channel is maintained.

Conversely, if a negative voltage $-V_{MAX}$ is applied to the gate electrode 5 (or if a positive voltage $+V_{MAX}$ is applied to the substrate 1), the ferroelectric film 4 is polarized to a state C. Even if the gate voltage is reduced to 0V, the polarization charge is only slightly reduced to a state D, i.e., a negative polarization (spontaneous polarization) of a considerable amount remains. A channel is not formed between the source diffusion layer 3 and the drain diffusion layer 2 during this process.

A memory device capable of nonvolatile storage of information can be constituted by associating the above spontaneous polarization polarities of the ferroelectric film 4 with data "0" and "1," respectively.

Although the MFSFET has the above characteristics, there have not been announced to date any practically usable devices of this kind. This is due to the following reasons: (1) a silicon substrate is damaged when a ferroelectric material is deposited thereon by sputtering; (2) when the ferroelectric material deposited on the silicon substrate is subjected to a heat treatment, it diffuses into the substrate and deteriorate the FET characteristics; and (3) where the ferroelectric material is directly deposited on the silicon substrate, a desired hysteresis characteristic is hardly obtained due to incomplete crystal orientation of the ferroelectric film.

In order to avoid the problems (1) and (2), a MFSFET device has been proposed in which an insulating buffer layer made of, e.g., $SiO_2$ is interposed between the ferroelectric film and the silicon substrate (Technical Study Reports of the Institute of Electronics and Communication Engineers, Vol. 78, No. 179, pp. 1-8, 1978).

However, in the above device employing the insulating buffer layer, the gate structure constitutes a capacitor including a multilayer of the ferroelectric film and the buffer layer. Since a large part of the voltage applied to the gate electrode 5 is allocated to the buffer layer, a divided voltage across the ferroelectric film is reduced, which will cause an another problem that the operating voltage should be increased as much. Further, even with the above buffer layer, it is difficult to improve the crystal orientation of the ferroelectric film.

FIGS. 3 and 4 shows conventional examples of nonvolatile semiconductor memories that perform information storage utilizing residual polarization in a ferroelectric material.

In the nonvolatile semiconductor memory shown in FIG. 3, one memory cell consists of one memory transistor MTr and two selection transistors STr1, STr2. The memory transistor MTr is a field-effect transistor having a gate structure of a metal film and a ferroelectric film on a semiconductor layer.

Data write, erase and read operations on a memory cell C1 are briefly described below.

To effect data writing, word lines $WL1_1$, $WL1_2$ are grounded and a word line $WL1_3$ is supplied with a positive voltage (e.g., 5V). If a positive high voltage (e.g., 10V) is applied to a bit line BL1 in this state, it will acts on the ferroelectric film of the memory transistor MTr via the selection transistor STr2 of the memory cell C1. That is, an electric field acts on the ferroelectric film to polarize it, so that the memory transistor MTr is rendered non-conductive if it is of the n-channel type. It is assumed that this state is a written state of data "1."

To erase the written data, the word lines $WL1_1$, $WL1_3$ and the bit line BL1 are grounded, and the word line $WL1_2$ is supplied with a positive high voltage. As a result, an electric field of a direction opposite to that in the write operation acts on the ferroelectric film of the memory transistor MTr of the memory cell C1, and the ferroelectric film is polarized in the opposite direction. The memory transistor Mtr is rendered conductive if it is of the n-channel type (i.e., data "0" is retained).

To effect data reading, the word lines $WL1_1$, $WL1_3$ are supplied with a positive voltage and the word line $WL1_2$ is grounded. In this state, a sense amplifier SA that is connected to the bit line BL1 detects whether there exists a current. Data "1" is detected if no current flows, and data "0" is detected if a current flows.

In the nonvolatile semiconductor memory shown in FIG. 4, one memory cell consists of one selection transistor STr and one ferroelectric capacitor FC.

Data writing to a memory cell C1 is effected by rendering the ferroelectric capacitor FC in a certain polarization state by applying a positive voltage to a word line WL1 and a positive high voltage to a bit line BL1.

Data erasing is effected by polarizing the ferroelectric capacitor to the opposite polarity by applying a positive voltage to the word line WL1 and a negative high voltage to the bit line BL1.

In data reading, a positive voltage is applied to each of the word line WL1 and the bit line BL1. Whether the written data is "0" or "1" is judged by the amplitude of a current detected by a sense amplifier SA connected to the bit line BL1.

However, the conventional memories having the above configurations are associated with the following problems.

The nonvolatile semiconductor memory of FIG. 3, in which one memory cell consists of one memory transistor and two selection transistors, inevitably has a large cell area and is not suitable for higher integration.

The configuration of the nonvolatile semiconductor memory of FIG. 4 allows higher integration to a certain degree. However, during the data read operation, the polarization state in the ferroelectric capacitor is changed by a current flowing into the ferroelectric capacitor (what is called "destructive reading". As a result, data refreshing is required and, therefore, more complex peripheral circuits are needed.

SUMMARY OF THE INVENTION

The present invention has been made in view of the above circumstances in the art, and has an object of providing a nonvolatile semiconductor memory device (MFSFET device) having a ferroelectric film of superior crystal form and being capable of low-voltage operation.

Another object of the invention is to provide a nonvolatile semiconductor memory which enables higher integration, and in which data refreshing is not required in data reading.

According to a first aspect of the invention, a nonvolatile memory device comprises:
 a semiconductor layer;
 a field-effect transistor formed on the semiconductor layer and comprising source and drain regions and a channel region;
 a conductive film containing metal atoms and formed on the channel region; and
 a ferroelectric capacitor comprising a ferroelectric film formed on the conductive film and a top electrode formed on the ferroelectric film, the ferroelectric capacitor storing data in the form of spontaneous polarization in the ferroelectric film;
 wherein the conductive film serves both as a gate electrode of the field-effect transistor and as a bottom electrode of the ferroelectric capacitor.

According to a second aspect of the invention, a nonvolatile semiconductor memory comprises:
 two memory cells formed adjacent each other on a semiconductor layer, each of the two memory cells comprising:
 two selection transistors;
 a plurality of memory transistors formed between the two selection transistors such that the two selection transistors and the memory transistors are connected in series, and that a source/drain diffusion layer is shared by adjacent ones of the selection transistors and the memory transistors; and
 a plurality of ferroelectric capacitors each comprising a first electrode, a ferroelectric film and a second electrode, and each formed so as to correspond to one of the memory transistors such that the first electrode is connected to a gate electrode of the corresponding memory transistor;
 a first word line connected to gate electrodes of two of the selection transistors located at ends of an area in which the two memory cells are formed;
 a plurality of second word lines connected to respective connecting points of the gate electrodes of the memory transistors and the first electrodes of the ferroelectric capacitors;
 a plurality of third word lines connected to the respective second electrodes of the ferroelectric capacitors;
 two fourth word lines connected to respective gate electrodes of two of the selection transistors adjacent to each other; and
 a bit line connected to a drain diffusion layer shared by the two adjacent selection transistors.

In the above nonvolatile semiconductor memory, initializing and data erasing to each memory cell is effected by equalizing the polarization polarity of all the ferroelectric capacitors by applying a predetermined voltage to all the third word lines.

In data writing, a predetermined voltage is applied to the bit line of a pair of memory cells including the subject memory cell and a predetermined voltage is applied to one of the fourth word lines, so that the head selection transistor of the subject memory cell is made conductive and the subject memory cell is selected. Then, predetermined voltages are applied to the second and third word lines so that a voltage on the bit line sequentially acts on the respective memory transistors in the order of arrangement starting from the memory transistor farthest from the bit line.

In data reading, a reading circuit is connected to the bit line of a pair of memory cells including the subject memory cell and a predetermined voltage is applied to one of the fourth word lines, so that the subject memory cell is selected. Then, a predetermined voltage is applied to the first word line to make the end selection transistor conductive. Further, predetermined voltages are applied to the second and third word lines to make the memory transistors of the bits other than the selected bit in a conductive state. Data of the selected bit is read out by detecting whether a current flows through the bit line.

BRIEF DESCRIPTION OF THE DRAWINGS

FIG. 7(a) is a sectional view showing a structure of a nonvolatile semiconductor memory according to a second embodiment of the invention;

FIG. 7(b) is a plan view of the memory of FIG. 7(a); and

DESCRIPTION OF THE PREFERRED EMBODIMENTS

Embodiments of the present invention are described hereinafter with reference to the accompanying drawings.

Figure 1:
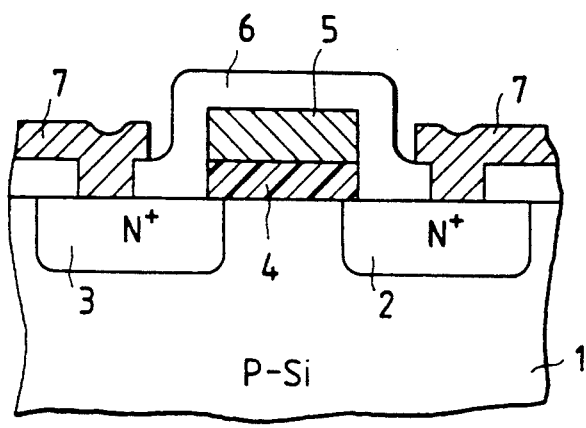
FIG. 1 is a sectional view showing a structure of a conventional MFSFET device.
Figure 2:
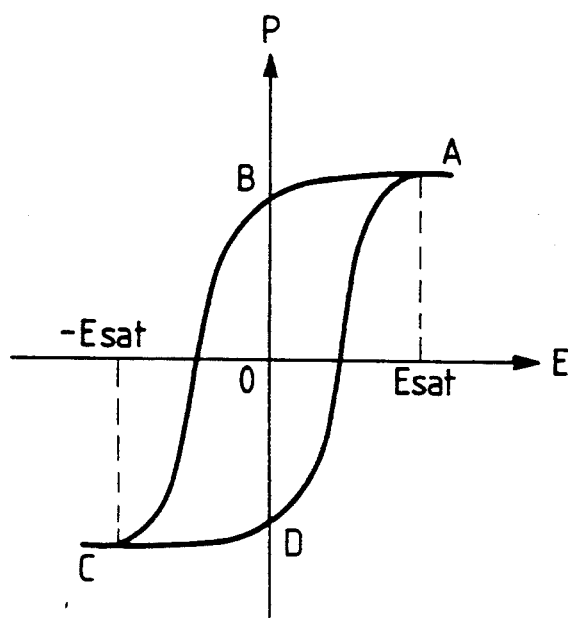
FIG. 2 is a graph showing a hysteresis characteristic of a ferroelectric film.
Figure 3:
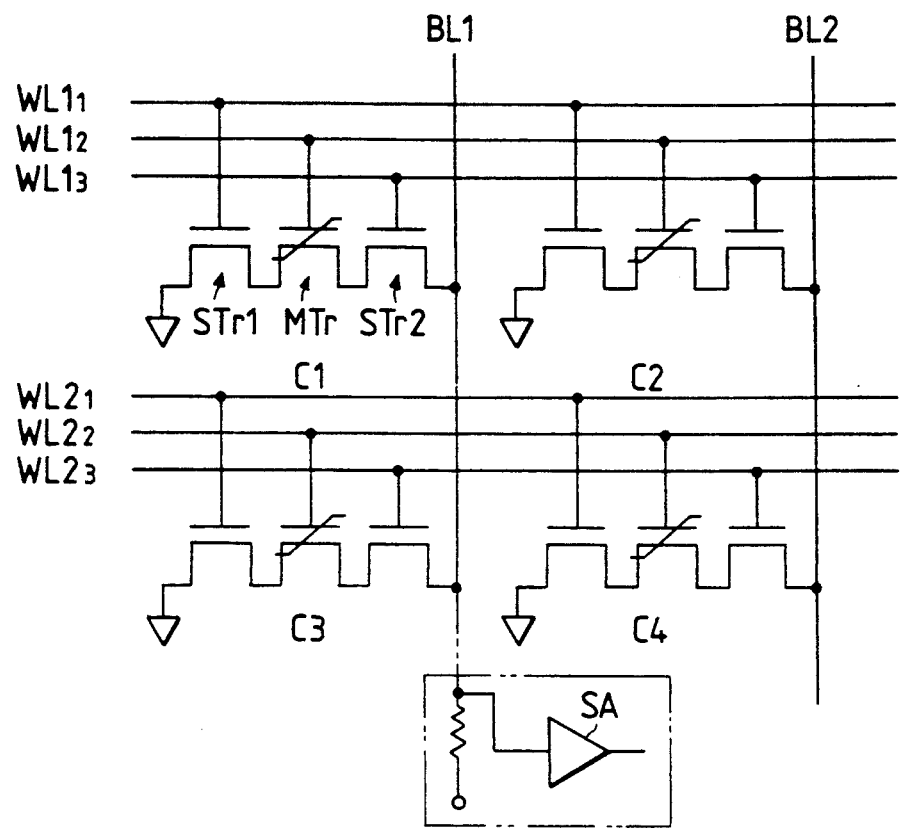
FIG. 3 is a circuit diagram showing an example of a conventional nonvolatile semiconductor memory.
Figure 4:
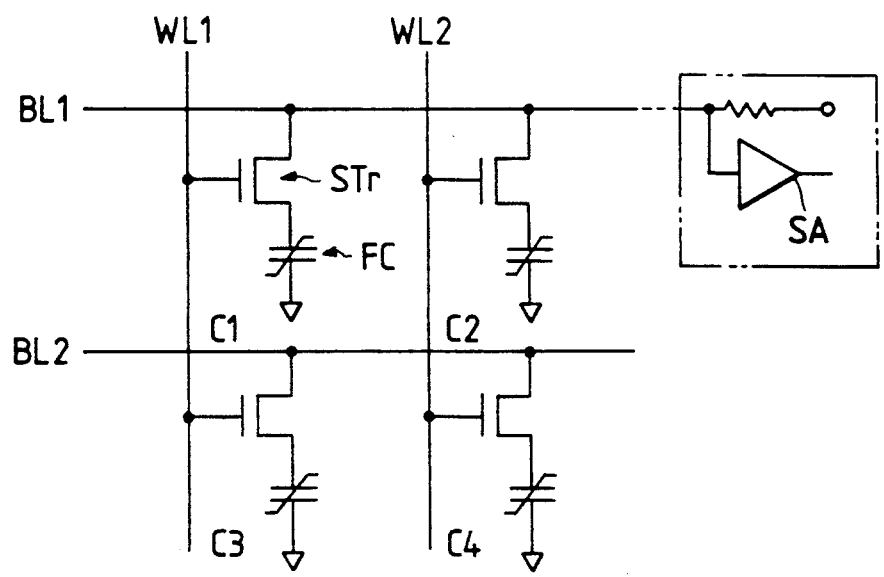
FIG. 4 is a circuit diagram showing another example of a conventional nonvolatile semiconductor memory.
Figure 5:
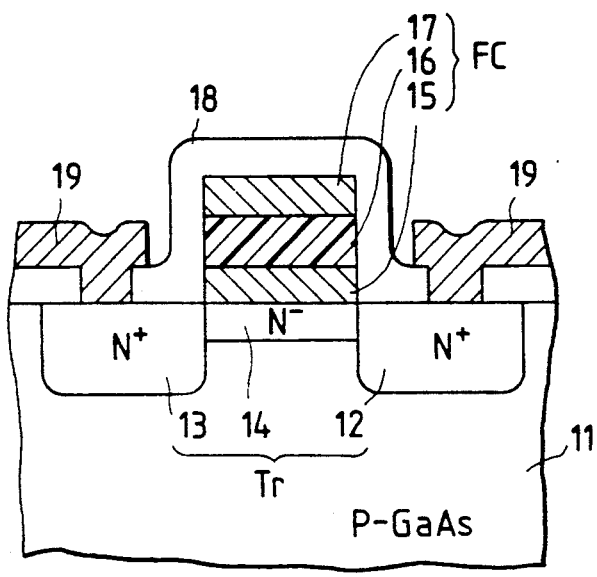
FIG. 5 is a sectional view showing a structure of a nonvolatile semiconductor memory device according to a first embodiment of the present invention.

FIG. 5 is a sectional view showing a structure of a nonvolatile semiconductor memory device according to an embodiment of the invention. Reference numeral 11 is a p-type GaAs substrate as a semiconductor substrate. A silicon substrate, a GaAs layer formed on a silicon substrate, etc. may be employed as the semiconductor substrate. An n+ drain diffusion layer 12 and an n+ source diffusion layer 13 are formed in the GaAs substrate 11. An n− diffusion layer 14 is formed in a channel region between the drain and source diffusion layers 12 and 13 to control the threshold voltage of a field-effect transistor Tr.

On the n− diffusion layer 14, a conductor film 15 containing metal atoms and serving both as a gate electrode of the transistor Tr and as a bottom electrode of a ferroelectric capacitor FC, a ferroelectric film 16 and a top electrode 17 are formed in this order. In this embodiment, the conductor film 15 and the ferroelectric film 16 are made of platinum and PZT ($PbZr_xTi_{1-x}O_3$), respectively. This is because a ferroelectric film having a superior crystal orientation can be obtained by forming a PZT film on a platinum film.

In addition to platinum, gold etc. may be used as a material for the conductive film 15. In addition to PZT, the following materials may be employed for the ferroelectric film 16: PLZT, $PbTiO_3$, $BaTiO_3$, etc., which have the $ABO_3$ structure (A and B are metal elements), i.e., perovskite structure as in the case of PZT. Other materials for the ferroelectric film 16 include halogen compounds of $BaMgF_4$, $NaCaF_3$, $K_2ZnCl_4$, etc. and chalogen compounds of $Zn_{1-x}Cd_xTe$, GeTe, $Sn_2P_2S_6$, etc.

To prevent an event that metal atoms of the conductor film 15 are spiked into the substrate, it is preferred that the conductor film 15 be in a multilayer structure. For example, in the case of the silicon substrate, Pt/PtSi and Au/AuSi are preferably used as the conductor layer 15.

In addition to metal such as platinum, polysilicon doped with phosphorus etc. may be used as a material for the top electrode 17. In FIG. 5, reference numeral 18 represents an interlayer insulating film made of $SiO_2$ doped with phosphorus (PSG), PSG further doped with boron (BPSG), or the like. Reference numeral 19 represents metal leads to be connected to the drain diffusion layer 12 and the source diffusion layer 13, respectively.

Figure 6:
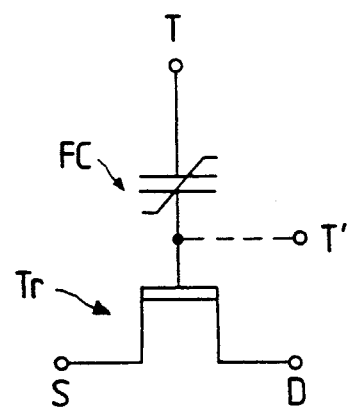
FIG. 6 is a circuit diagram showing an equivalent circuit of the device of FIG. 5.

FIG. 6 shows an equivalent circuit of the above nonvolatile semiconductor memory device (MFSFET). In the figure, symbol Tr represents the field-effect transistor consisting of the drain and source diffusion layers 12, 13, the n− diffusion layer 14 and the conductor film 15. Symbol FC represents the ferroelectric capacitor consisting of the conductor film 15, ferroelectric film 16 and the top electrode 17.

A manufacturing method of the above MFSFET device is outlined below.

First, the n− diffusion layer 14 is formed in the GaAs substrate 11. Then, respective films to become the conductor film 15, ferroelectric film 16 and top electrode 17 are laid in this order on the substrate 11. A ferroelectric film of, e.g., PZT to become the ferroelectric film 16 are deposited by the sol-gel method with spin coating, MOD (metal organic decomposition) method, sputtering method, MOCVD (metal organic chemical vapor deposition) method or laser abrasion method. The above multiple films are continuously shaped by anisotropic etching such as ion milling or RIE (reactive ion etching). Using the ferroelectric capacitor FC thus formed as a mask, n-type impurity ions are implanted to form the drain and source diffusion layers 12, 13. Then, the interlayer insulating film 18 is deposited by the CVD (chemical vapor deposition) method. After contact holes for the drain and source diffusion layers 12, 13 are formed in the interlayer insulating film 18, a metal film is deposited and then patterned to form the metal leads 19.

Next, the operation of the above MFSFET device is described.

A Schottky barrier is obtained by forming the conductor film 15 made of a metal such as platinum or a conductive metal compound such as PtSi directly on the semiconductor substrate such as the GaAs substrate 11. An FET device is constituted by further forming the drain and source diffusion layers 12, 13 on both sides of the conductor film 15. This FET device can be changed over between the conductive and non-conductive states by applying proper voltages to the conductor film 15 serving as the gate electrode.

If the ferroelectric capacitor FC having the conductor film 15 as the bottom electrode is formed on the channel region 14 of the FET device and a proper voltage (negative voltage in this embodiment) is applied to the top electrode 17 of the ferroelectric capacitor FC, a certain voltage (positive voltage in this embodiment) is generated in the conductor film 15, so that a channel is formed to render the FET device conductive. Even if the voltage applied to the top electrode 17 is thereafter reduced to 0V, the voltage between the conductor film 15 and the substrate 11 is maintained by the spontaneous polarization in the ferroelectric film 16, to leave the FET device in the conductive state.

On the other hand, if a proper positive voltage is applied to the top electrode 17 of the ferroelectric capacitor FC, or if a proper negative voltage is applied to a terminal T′ (see FIG. 6) connected to the conductor film 15, the polarity of the spontaneous polarization in the ferroelectric film 16 is reversed, and the FET device is rendered non-conductive and thereafter left in this state.

By associating the conductive and non-conductive states of the MFSFET device with data "0" and "1," a nonvolatile memory device can be realized which maintains the written state without applying a power supply voltage.

As described above, according to the above embodiment, since almost all the voltage applied to the ferroelectric capacitor is allocated to the ferroelectric film, the memory device can operate with a lower voltage than the conventional memory device having the insulating buffer layer between the ferroelectric film and the semiconductor substrate. Further, since a ferroelectric film having a superior crystal orientation can be formed on the conductor film containing metal atoms, the spontaneous polarization in the ferroelectric film becomes large, which will increase a reading margin and make it possible to realize nonvolatile semiconductor memory devices superior in practical utility.

Figure 8:
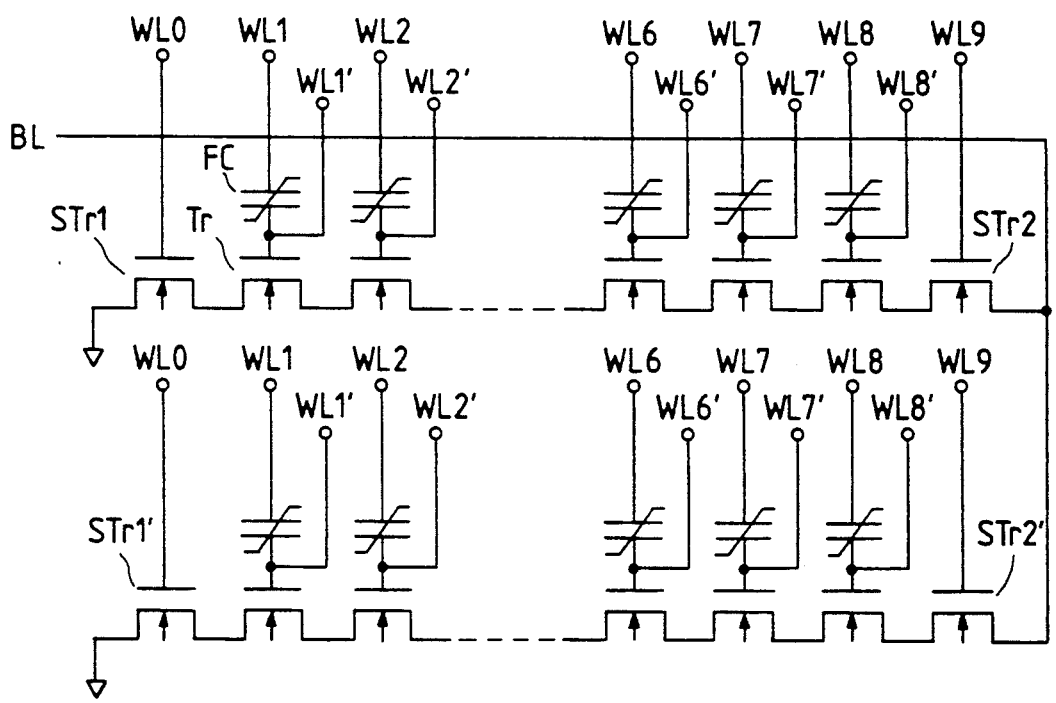
FIG. 8 is a circuit diagram showing the nonvolatile semiconductor memory of the second embodiment.

FIG. 7(a) (sectional view) and FIG. 7(b) (plan view) show a structure of a nonvolatile semiconductor memory according to a second embodiment of the invention. FIG. 8 is an equivalent circuit thereof.

In this nonvolatile semiconductor memory, two memory cells are formed in a device area separated by field oxide films 102. Each memory cell has an 8-bit NAND-type structure, and consists of two selection transistors STr1, STr2, eight MOS transistors Tr1–Tr8 (from the side of the selection transistor Str1) that are connected in series and formed between the selection transistors STr1 and Str2, and ferroelectric capacitors FC1–FC8 (from the side of the selection transistor STr1) connected to the gate electrodes of the respective MOS transistors Tr1–Tr8. In the following description, to discriminate the corresponding constituent elements of the left side and right side memory cells in FIG. 7(a), mark "'" is attached to reference symbols for the constituent elements of the right side memory cell.

The cell structure is described with reference to FIGS. 7(a) and 7(b). In the figures, reference numeral 101 represents a p-type silicon substrate in which a device forming area 103 is separated by the field oxide films 102. Reference numeral 104 represents a source diffusion layer; 105, source/drain diffusion layers commonly used as the source and drain; and 106, a drain diffusion layer. The drain diffusion layer 106 serves for both selection transistors STr2 and STr2'. Between adjacent ones of the diffusion layers 104, 105 and 106, a gate electrode 108 or a common electrode 109 serving both as the gate electrode of the MOS transistor Tr and as a bottom electrode of the ferroelectric capacitor FC is formed on the substrate 101 via a gate oxide film 107.

The ferroelectric capacitors FC1–FC8 are formed on the respective MOS transistors Tr1–Tr8. Each ferroelectric capacitor FC has a multilayer structure consisting of a bottom electrode 109, a ferroelectric film 110 and a top electrode 111 that are arranged in this order from the bottom. The gate electrodes 108 and the ferroelectric capacitors FC1–FC8 are covered with an interlayer insulating film 112, on which a metal lead 113 is formed. The metal lead 113 is connected to the drain diffusion layer 106 and serves as a bit line BL.

As shown in FIG. 8, the gate electrodes 108 of the selection transistors Str1, Str1' located at the ends of the two memory cells are connected to a word line WL0 (first word line). The top electrodes FC1–FC8 of the ferroelectric capacitors FC1–FC8 are connected to word lines WL1–WL8 (third word lines), respectively. The common electrodes 109 of the ferroelectric capacitors FC1–FC8 are connected to word lines WL1'–WD8' (second word lines). The gate electrodes 108 of the selection transistors STr2, STr2' located at the heads of the two memory cells are connected to word lines WL9, WL9' (fourth word lines), respectively.

Next, a manufacturing method of the above nonvolatile semiconductor memory is described.

First, the field oxide films 102 are formed on the silicon substrate 101 by the LOCOS (local oxidation of silicon) method to separate the device forming area 103. The gate oxide film 107 is formed in the device forming area 103 by thermal oxidation, and a conductive film to become the gate electrodes 108 and the common electrodes 109 is formed thereon. To simplify the manufacturing process, it is preferred that the gate electrodes 108 and the common electrodes 109 be made of the same electrode material. For example, where lead zirconate titanate (PZT) is used as a material for the ferroelectric film 111, platinum is deposited by sputtering so that a PZT film is formed thereon with superior crystal orientation. Where polysilicon doped with phosphorus etc. is used as a material for the gate electrodes 108 and the common electrodes 109, it is preferred that a multilayer film be provided by depositing platinum, which well matches PZT, on the polysilicon film.

Then, a ferroelectric material is deposited on the conductive film thus formed. In addition to PZT, PLZT, i.e., $(Pb_xLa_{1-x})(Zr_yTi_{1-y})O_3$ may be employed as the ferroelectric material. These types of ferroelectric films are formed by the sol-gel method with spin coating, MOD (metal organic decomposition) method, sputtering method, MOCVD (metal organic chemical vapor deposition) method, laser abrasion method, etc.

Another conductive film to become the top electrodes 111 is deposited on the ferroelectric film thus formed. Materials for the conductive film include metal (e.g., platinum), polysilicon doped with phosphorus etc., silicide, etc.

After a resist pattern is formed by photoetching, the conductive film, ferroelectric film and conductive film formed in this order on the gate oxide film 107 are shaped at one time into the ferroelectric capacitors FC1–FC8 consisting of the common electrodes 109, ferroelectric films 110 and top electrodes 111, and the gate electrodes 108 of the selection transistors STr. As the shaping method, the ion milling method, which is particularly suitable for fine processing, and the reactive ion etching (RIE) method are preferred. Then, the ferroelectric films 110 and the top electrodes 111 that remain on the gate electrodes 108 are removed. Even where these films 110 and electrodes 111 are not removed, they will not cause any problems.

Using the gate electrodes 108 and the ferroelectric capacitors FC1–FC8 as a mask, ions of phosphorus etc. are implanted into the silicon substrate 101 to form, by self-aligning, n+ impurity regions of the source diffusion layers 104, source/drain diffusion layers 105 and drain diffusion layers 106.

Then, the interlayer insulating film 112 is deposited by the CVD method. The interlayer insulating film 112 is made of, for instance, phosphorus-added silicon dioxide (PSG) or boron-added PSG (BPSG). After the contact hole is formed in the interlayer insulating film 112 over the drain diffusion layer 106, a conductive film of, e.g., Al-Si is deposited by sputtering and then patterned by photoetching. Thus, the metal lead 113 is formed.

Referring to FIG. 8, data write, erase and read operations on the nonvolatile semiconductor memory of the second embodiment are described below.

The following description is made of a case in which data "10010000" is written into the upper memory cell in FIG. 8 (i.e., left-side memory cell in FIG. 7(a)).

First, to initialize the ferroelectric capacitors FC1–FC8 of all memory cells, i.e., to make all memory cells retain data "0," a positive high voltage (e.g., 15V) is applied to the word lines WL1–WL8 and the word lines WL1'–WL8' are opened, to render all the ferroelectric capacitors FC1–FC8 in a same, certain polarization state. The silicon substrate 101 is grounded in each of the initializing, write, erase and read operations.

Then, a positive high voltage is applied to the bit line BL, and the other bit lines (now shown) are grounded. Since two memory cells are connected to the bit lien BL, to select the upper memory cell the selection transistor STr2 is made conductive by applying a positive voltage (e.g., 5V) to the word line WL9. The lower memory cell is not selected in this case, because the word line WL9' is grounded and therefore the selection transistor STr2' is not conductive.

Then, while the word line WL1 is grounded and the word line WL1' is opened, the other word lines WL2-WL8, WL2'-WL8' are supplied with a positive voltage (e.g., 5V). As a result, the MOS transistors Tr2-Tr8 of the upper memory cell are rendered conductive, and the positive high voltage being supplied via the bit line BL is applied to the MOS transistor Tr1 of the upper transistor. This will cause an electric field in the direction opposite to that in the initialized state to act on the ferroelectric capacitor FC1, which is thereby polarized to have the opposite polarity. That is, data "1" is written into the ferroelectric capacitor FC1. In this case, since the voltage across each of the other ferroelectric capacitors FC2-FC8 remains the same (i.e., is kept at 5V), the polarization state of these capacitors remains in the initialized state. With the above operation, data "10000000" has been written into the upper memory cell.

Upon completion of the above first stage writing, the second stage writing starts. A positive high voltage is applied to the bit line BL, the other bit lines are grounded, and a positive voltage is applied to the word line WD9. In order to make the third-bit MOS transistor Tr3 of the upper memory cell non-conductive, a negative voltage (e.g., −5V) is applied to the word lines WL3 and WL3'. Further, while the word line WL4 is grounded and the word line WL4' is opened, the word lines WL5-WL8 and WL5'-WL8' are supplied with a positive voltage. As a result, the MOS transistors Tr5-Tr8 of the upper memory cell become conductive, so that the positive high voltage being supplied via the bit line BL is applied to the MOS transistor Tr4. This will cause an electric field in the direction opposite to that in the initialized state to act on the ferroelectric capacitor FC4, which is thereby polarized to have the opposite polarity. That is, data "1" is written into the ferroelectric capacitor FC4. In this case, the polarization state of the other ferroelectric capacitors FC1-FC3, FC5-FC8 remains in the initialized state.

After performing the two write operations of the first and second stages, data "10010000" is written into the upper memory cell. In this manner, data is sequentially written into the transistors Tr1-Tr8 such that the farthest transistor is first given data. Therefore, to write data of, e.g., "10010010," three times of writing operations are performed.

In the data erasing, the above-described initializing operation is performed to make all the bits have data "0" at one time.

The data reading is performed in the following manner. For example, to read the fourth bit data of the upper memory cell, a reading circuit (not shown), i.e., a sense amplifier is connected only to the bit line BL, and a positive voltage is applied to the word line 109 to select the upper memory cell. In this state, the word line WL4 is grounded, the word line WL4' is opened, and all the other word lines are supplied with a positive voltage. As a result, the fourth-bit MOS transistor Tr4 is rendered conductive or non-conductive depending on the polarization state of the ferroelectric capacitor FC4, and all the other transistors including the selection transistors STr1, STr2 become conductive. Therefore, the polarization state (i.e., data) of the ferroelectric capacitor FC4 can be read out by detecting a current on the bit line BL. In the memory of this embodiment, since data is read out in accordance with whether the MOS transistor Tr of the selected bit is conductive or non-conductive, the polarization state of the ferroelectric capacitor is not changed by reading data from that capacitor. That is, non-destructive reading is realized.

As described above, in the nonvolatile semiconductor memory of the second embodiment, the MOS transistors Tr of one byte are connected in series and the adjacent MOS transistors share the single source/drain diffusion layer. Therefore, the total diffusing area can be reduced to half.

The device separation by the field oxide films 102 is performed on a two-byte basis, in contrast to the conventional case of bit-by-bit basis. Therefore, the area of the field oxide films 102 can be reduced considerably.

Since the selection transistors STr2, STr2' located at the heads of the two memory cells formed in one device forming area share the drain diffusion layer 106, only one contact hole is needed through which the metal lead (bit line) 113 is connected to the drain diffusion layer 106. Therefore, the area for the connection is reduced as much.

Because of the above advantages, it becomes possible to realize high-density nonvolatile semiconductor memories.

By virtue of the structure of the nonvolatile semiconductor memory, the polarization state of the ferroelectric capacitor is not changed by reading data therefrom. Therefore, data refreshing is not required, so that peripheral circuits can be simplified.

Since the common electrode 109 serves both as the gate electrode of the MOS transistor and as one electrode of the ferroelectric capacitor, the manufacturing process of the nonvolatile semiconductor memory can be simplified.

While the second embodiment is described of the case in which one memory cell consists of eight MOS transistors, the invention is not limited to such a case. The number of MOS transistors constituting one memory cell is selected arbitrarily from numbers not less than two.

Although the second embodiment is described of the case in which the memory cell consists of n-channel MOS transistors, it is apparent that it may consist of p-channel MOS transistors.

Although in the second embodiment the common electrode 109 serves both as the gate electrode of the MOS transistor and as bottom electrode of the ferroelectrode capacitor, the invention is not limited to such a structure. The gate electrode of the MOS transistor and bottom electrode of the ferroelectric capacitor may be formed separately, which are then connected to the same word line.

Further, while in the second embodiment the memory transistors are MOSFETs, the nonvolatile semiconductor memory device of the first embodiment, which includes a MESFET, may be used as each of the memory transistors. In the latter case, the selection transistors should also be MESFETs.

What is claimed is:
1. A nonvolatile semiconductor memory device comprising:
   a semiconductor layer;
   a field-effect transistor formed on the semiconductor layer and comprising source and drain regions and a channel region;
   a conductive film containing metal atoms and formed on the channel region; and a ferroelectric capacitor comprising a ferroelectric film formed on the conductive film and a top electrode formed on the ferroelectric film, the ferroelectric capacitor storing data in the form of spontaneous polarization in the ferroelectric film;

wherein the conductive film serves both as a gate electrode of the field-effect transistor and as a bottom electrode of the ferroelectric capacitor.

2. The nonvolatile semiconductor memory device according to claim 1, wherein the conductive film and the ferroelectric film are made of platinum and PZT, respectively.

3. The nonvolatile semiconductor memory device of claim 1, wherein the conductive film has a multilayer structure.

* * * * *